(12) United States Patent
Grosse et al.

(10) Patent No.: US 9,342,645 B2
(45) Date of Patent: May 17, 2016

(54) METHOD FOR TESTING A COMPUTER PROGRAM

(71) Applicant: Synopsys, Inc., Mountain View, CA (US)

(72) Inventors: Joerg Grosse, Schliersee-Neuhaus (DE); Mark Hampton, La Cote St. Andre (FR)

(73) Assignee: Synopsys, Inc., Mountain View, CA (US)

( * ) Notice: Subject to any disclaimer, the term of this patent is extended or adjusted under 35 U.S.C. 154(b) by 4 days.

(21) Appl. No.: 13/908,870

(22) Filed: Jun. 3, 2013

(65) Prior Publication Data
US 2014/0019925 A1     Jan. 16, 2014

Related U.S. Application Data

(63) Continuation of application No. 12/516,546, filed as application No. PCT/DE2007/002146 on Nov. 28, 2007, now Pat. No. 8,468,503.

(30) Foreign Application Priority Data

Nov. 28, 2006    (DE) .......................... 10 2006 056 432

(51) Int. Cl.
    *G06F 9/44*           (2006.01)
    *G06F 17/50*         (2006.01)
    *G06F 11/36*         (2006.01)

(52) U.S. Cl.
CPC ........ *G06F 17/5081* (2013.01); *G06F 11/3688* (2013.01)

(58) Field of Classification Search
CPC .. G06F 17/50; G06F 17/5081; G06F 11/3688
See application file for complete search history.

(56) References Cited

U.S. PATENT DOCUMENTS 3,711,863 A    1/1973    Bloom
5,694,540 A    12/1997   Humelsine et al.
(Continued)

FOREIGN PATENT DOCUMENTS

EP         0684557 A2    11/1995
FR         2873832        2/2006

OTHER PUBLICATIONS

Patrice Vado et al. "A Methodology for Validating Digital Circuits with Mutation Testing", [Online], May 2000, pp. 343-346, [Retrieved from Internet on Oct. 27, 2014], <http://ieeexplore.ieee.org/stamp/stamp.jsp?tp=&arnumber=857100>.*

(Continued)

*Primary Examiner* — Thuy Dao
*Assistant Examiner* — Ziaul A Chowdhury
(74) *Attorney, Agent, or Firm* — Alston & Bird LLP

(57) ABSTRACT

A method for testing a circuit specification after changing a first version of the circuit specification into a second version of the circuit specification due to a revision of the circuit specification includes receiving a first set of mutations that can be or have been inserted into the first version of the circuit specification and a second set of mutations that can be inserted into the second version of the circuit specification computer program. Changed and unchanged mutations are identified in the first set of mutations and in the second set of mutations based on a comparison between the second version of the circuit specification and against the first version of the circuit specification. Information configured to test the second version of the circuit specification is generated using at least a portion of the identified mutations classified as the changed mutations.

24 Claims, 2 Drawing Sheets

(56) References Cited

U.S. PATENT DOCUMENTS

Figure 1A:
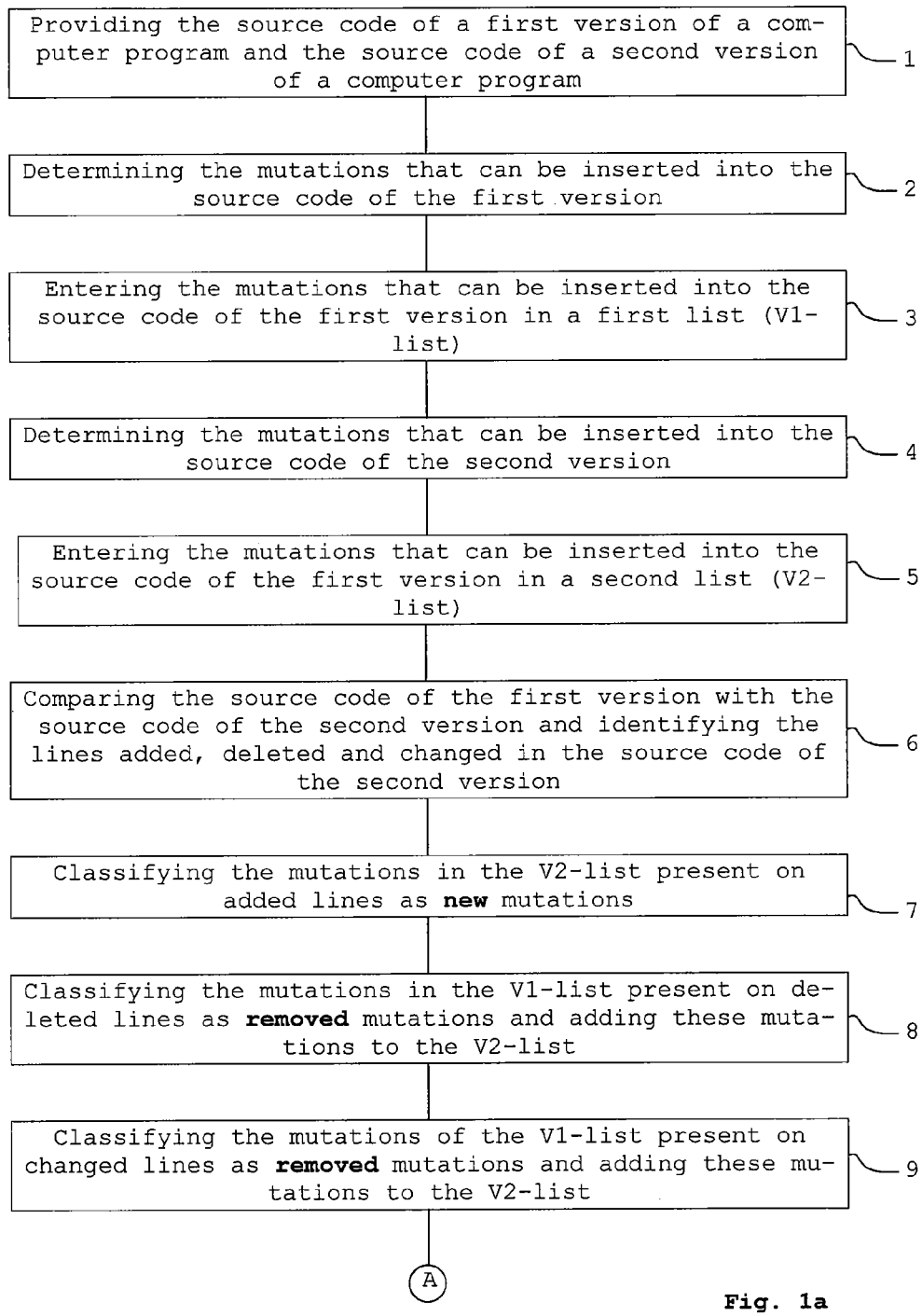

| | | | |
|---|---|---|---|
| 5,778,169 A * | 7/1998 | Reinhardt | G06F 11/3696 714/38.1 |
| 5,784,553 A | 7/1998 | Kolawa et al. | |
| 5,805,795 A | 9/1998 | Whitten | |
| 6,298,317 B1 * | 10/2001 | Wiemann | G06F 11/3688 703/14 |
| 6,606,735 B1 * | 8/2003 | Richardson | G06F 17/5081 716/112 |
| 6,931,629 B1 * | 8/2005 | Yount et al. | 717/126 |
| 6,948,154 B1 | 9/2005 | Rothermel et al. | |
| 7,574,681 B2 * | 8/2009 | Hampton | 716/136 |
| 7,849,448 B2 | 12/2010 | Yunus et al. | |
| 7,873,945 B2 | 1/2011 | Musuvathi et al. | |
| 8,276,126 B2 | 9/2012 | Farnham et al. | |
| 8,468,503 B2 | 6/2013 | Grosse et al. | |
| 8,560,991 B1 * | 10/2013 | Fuss | G06F 17/5081 324/528 |
| 8,584,095 B2 * | 11/2013 | Bhandari | G06F 11/3688 717/127 |
| 9,202,004 B1 * | 12/2015 | Cohen | G06F 17/5081 |
| 2007/0162268 A1 * | 7/2007 | Kota | G06F 17/5045 703/14 |
| 2007/0266351 A1 * | 11/2007 | Hampton | 716/4 |
| 2008/0126867 A1 * | 5/2008 | Pandarinathan | G06F 11/3688 714/37 |
| 2009/0044177 A1 | 2/2009 | Bates et al. | |
| 2011/0314334 A1 * | 12/2011 | Silver | G06F 11/3688 714/32 |

OTHER PUBLICATIONS

Patrice Vado et al. "A Methodology for Validating Digital Circuits with Mutation Testing" [Online], IEEE2000, pp. 343-346, [Retrieved from Internet on May 26, 2015], <http://ieeexplore.ieee.org/stamp/stamp.jsp?tp=&arnumber=857100>.*

Ghassan Al Hayek et al. "From Specification Validation to Hardware Testing: A Unified Method", [Online], IEEE 1996, pp. 885-893, [Retrieved from Internet on Jan. 3, 2016], <http://ieeexplore.ieee.org/stamp/stamp.jsp?tp=&arnumber=557150>.*

Pramodchandran et al. "Prediction of Analog Performance Parameters Using Fast Transient Testing", [Online], IEEE 2002, pp. 349-361, [Retrieved from Internet on Jan. 3, 2016], <http://ieeexplore.ieee.org/stamp/stamp.jsp?tp=&arnumber=986428>.*

Elaine Weyuker et al."Automatically Generating Test Data from a Boolean Specification" [Online], IEEE 1994, pp. 353-363, [Retrieved from Internet on Jan. 3, 2016], <http://web.soccerlab.polymtl.ca/log6305/protected/papers/WeyVNS.pdf>.*

Man F. Lau et al., "An Extended Fault Class Hierarchy for Specification-Based Testing", {Online], ACM 2005, pp. 247-276, [Retrieved from Internet on Jan. 3, 2016], <http://delivery.acm.org/10.1145/1080000/1072998/p247-lau.pdf>.*

Geist et al., "Estimation and Enhancement of Real-Time Software Reliability Through Mutation Analysis", IEEE Transactions on Computer, vol. 41, No. 5, May 1992, pp. 550-558.

Software Mutation Testing, Jan. 21, 2003, http://everything2.com/index.pl?node_id=1418661&displaytype=printable&lastnode_id+1418661.

Vado et al., "A Methodology for Validating Digital Circuits with Mutation Testing", May 2000, 4 pages.

J.H. Andrews et al., "Is Mutation an Appropriate Tool for Testing Experiments?" [Online, May 2005, pp. 402-411 [Retrieved from Internet on Jul. 26, 2012], http://ieeexplore.ieee.org./stamp/stamp.jsp?tp=&arnumber=1553583&tag=1.

Sunwoo Kim et al., "Class Mutation: Mutation Testing for Object-Oriented Programs" [Online], 2000, pp. 1-15, [Retrieved from Internet on Jul. 26, 2013], http://citeseerx.ist.psu.edu/viewdoc/download?doi=10.1.1.31.7963&rep=rep1&type=pdf.

W. Richards Adrion et al., "Validation, Verification, and Testing of Computer Software", [Online], Jun. 1982, pp. 159-192. [Retrieved from the Internet on Feb. 2, 2013], https://www.cs.drexel.edu/~jhk39/teaching/cs576su06/week1Readings/adrion.pdf.

A. Jefferson Offutt et al., "Exmperiments Data flow and Mutation Testing", [Online], Feb. 1994, pp. 1-13, [Retrieved from the Internet on Feb. 2, 2013], http:cs.gmu.edu/~tr-admin/papers/ISSE-TR-94-05.pdf.

Juliano R. Toaldo et al., "Applying Mutation Testing in Prolog Programs", [Online], 2008, pp. 1-12, [Retrieved from the Internet on Feb. 2, 2013], http://citeseerx.ist.psu.edu/viewdoc/download?doi+10.1.1.88.5328&rep=rep1&type=pdf.

W.K. Chan et al., "Fault-Based Testing of Database Application Programs with Conceptual Data Model", [Online], IEEE—2005, pp. 1-11. [Retrieved from the Internet on Feb. 2, 2013], https://www.citeseerx.ist.psu.edu/viewdoc/download?doi=10.1.1.60.4501&rep=rep1&type=pdf.

International Search Report for International Patent Application No. PCT/DE2007/002146, mailed on Sep. 17, 2008, 5 pages.

Non-Final Office Action for U.S. Appl. No. 12/516,546, mailed on Aug. 17, 2012; 15 pages.

Notice of Allowance for U.S. Appl. No. 12/516,546, mailed on Feb. 14, 2013, 6 pages.

* cited by examiner

METHOD FOR TESTING A COMPUTER PROGRAM

The Invention relates to a method for testing a computer program after changing a first version of the computer program into a second version of the computer program due to a revision of the computer program.

According to the state of the art the development of a computer program is associated with a time-consuming test method to detect errors in the computer program. Only in rare cases computer programs are written completely new. As a rule, the last version of the computer program is adapted to implement new functions or to correct problems. Such a new version of the computer program requires a completely testing of the software. However, there have been developed methods for the selective testing of new versions of the computer program that should permit a reduction of the testing effort.

U.S. Pat. No. 5,673,387 describes a method for the selective regression testing of a computer program. The method comprises the determination of the tests of a testing suite that have to be performed again after a change of the program. Therefore the units of the software are determined which were changed and changing information and coverage information are analyzed to determine the tests that cover the changed units. However, there is no proof that the selected tests are able to find errors that have been inserted as a result of a revision of the computer program. Moreover, the number of the selected tests may be very high and can comprise unnecessary tests.

U.S. Pat. No. 5,778,169 discloses a method for testing a computer program that shall produce only a minimum of coverage information. Here, the insertion of a first coverage-point into a first statement of a first version of a computer program and testing the first version by a number of tests is intended. Thereafter, a subset of the number of tests that have addressed the first coverage-point is determined using the test results. After a change of the first version into a second version of the computer program the second version is tested using the subset of tests. U.S. Pat. No. 5,778,169 uses the activation information of all tests for selecting the tests and selects the tests that have addressed a particular statement. This requires manual interventions of the programmer.

Thus, the state of the art is based on using code coverage results that are obtained from testing the first version of the computer program. Here, coverage means that specific statements have been performed while the program was performed. However, a disadvantage of these methods is that tests are performed which perhaps have no effect on changes of the source code at all. In other words, there is no proof that the tests selected on the basis of the coverage results test features that relate to the change of the code. For this reason, the employment of such methods in modern test environments using constrained random tests is not or scarcely useful. This relates in particular to the validation of circuits.

It is an object of the invention to eliminate the drawbacks based on the prior art. In particular, there is indicated a method that permits a fast and more effective testing of a changed version of a computer program and is suitable for testing computer programs that define a circuit. Further, there are indicated uses of said method.

This object is solved by the features of claims 1 and 21. Suitable embodiments of the invention arise from the features of claims 2 to 20, 22 and 23.

According to the invention there is provided a method for testing a computer program after changing a first version of the computer program into a second version of the computer program due to a revision of the computer program, comprising (a) determining the mutations that can be or have been inserted into the first version of the computer program, and the mutations that can be inserted into the second version of the computer program; and (b) comparing the first version of the computer program with the second version of the computer program to determine changed and unchanged mutations in the second version against the first version, wherein (b1) the mutations present only in the first version of the computer program or only in the second version of the computer program are classified as changed mutations; and (b2) the mutations present in the first and the second version are classified as unchanged mutations.

A mutation is a deliberate change of the computer program. Mutations are inserted into the source code of the computer program for the mutation analysis and then analyzed by the mutation analysis. For example, mutations can be logic negation errors, omission of logic factors, incorrect logic factors, omissions of logic expressions, incorrect logic expressions, incorrect numerical values and case omissions.

With the mutation analysis it could be checked whether a mutation inserted into the computer program can be detected with at least one test ("test case") of the test set intended for testing the computer program ("test bench"). In this case, detection means that the test shows an error. Undetected mutations reveal whether the tests of a test set are sufficient to test the computer program. If one mutation is undetected by means of the existing tests of the test set, one test in the test set is absent or one or more tests in the test set are incomplete. In this case, the test set is incomplete. Thus, the mutation analysis permits an examination of the completeness of the test set that is to be used for testing the (unmutated) computer program.

By regression testing is meant the repeated performance of the tests of the test set that are used for testing the first version of the computer program, for testing the second version of the computer program. However, according to the invention there may be intended that additional tests are performed if the mutation analysis shows that the test set used for testing the first version of the computer program is incomplete.

According to the invention in step (a) are determined the mutations that can be inserted into the first version and the mutations that can be inserted into the second version. Methods for determining the mutations are known to the skilled person. It is essential that here the same previously set criteria are used for both versions for the selection of the mutations from one given set of mutations. To perform the method it is not required to insert the mutations into the source code actually. It is enough to know the mutation and the position at which it can be inserted.

Step (b) provides the comparison of the two versions to determine changed and unchanged mutations. Here it is preferred to compare the source code of the two versions with each other so that the changes made in the source code can be ascertained. With the help of these changes it is determined which mutations are affected by the changes (changed mutations) and which are not (unchanged mutations).

In a first embodiment of the invention the method comprises after step (b)

(c) the use of all or a part of the mutations which in step (b) have been classified as changed mutations for testing the second version of the computer program.

In a second embodiment of the invention the method comprises after step (b)

(c) the use of all or a part of the mutations which in step (b) have been classified as changed mutations for the mutation analysis of the second version of the computer program.

In a third embodiment of the invention the method comprises after step (b)

(c) the use of all or a part of the mutations which in step (b) have been classified as changed mutations for regression testing of the second version of the computer program.

In a fourth embodiment of the invention the method comprises after step (b)

(c) the use of all or a part of the mutations which in step (b) have been classified as changed mutations for the mutation analysis or regression testing of the second version of the computer program.

In all of the above-mentioned embodiments the results of a mutation analysis of the first version of the computer program obtained with the mutations that have been classified as unchanged mutations can readily be transferred to the second version, i.e. it is believed that the results of the unchanged mutations would be the same results with a mutation analysis of the second version of the computer program that have been already achieved with the mutation analysis of the first version of the computer program. In this way for example the results achieved with the mutation analysis of the first version of the computer program that consist in which unchanged mutations have been detected and which not can be transferred to the second version, i.e. it is believed that the unchanged mutations are or are not detected in the same way as with the first version.

Further, independent from the particular embodiment it can be provided that in step (b) as changed mutation classified mutations present in the second version but not in the first version are classified as new mutations. In addition, mutations classified as changed mutations in step (b) present in the first version but not in the second version can be classified as removed mutations.

Preferably, there is carried out a mutation analysis of the new mutations to test the second version of the computer program. However, if the mutation analysis of the new mutations resulted in that the test set used for testing the first version is not complete, so the second version is characterized as not completely tested or the test set is supplemented by such tests. Thereafter, the tests of the (supplemented) test set can be performed which are able to detect the new mutations.

Alternative or additionally, there may be carried out tests for testing the second version of the computer program that detected the mutations classified as removed mutations with a mutation analysis of the first version of the computer program. Performing these tests is hereinafter also designated as "reduced regression testing".

However, for testing the second version of the computer program in step (c) either only a mutation analysis of the new mutations with subsequently regression testing of the second version of the computer program or only performing tests that detected the mutations classified as removed mutations with a mutation analysis of the first version of the computer program may be provided.

In a preferred embodiment testing the second version of the computer program in step (c) comprises the steps of:

(c1) performing tests that upon a mutation analysis of the first version of the computer program detected the mutations classified as removed mutations to ascertain whether the second version of the computer program passes these tests; and (c2) subsequently performing a mutation analysis of the new mutations provided that the second version has passed all test carried out in step (c1).

Alternative, there may be provided that testing the second version of the computer program in step (c) comprises the steps of:

(c1) performing tests that upon a mutation analysis of the first version of the computer program detected the mutations classified as removed mutations to ascertain whether the second version of the computer program passes these tests; and (c2) subsequently performing a mutation analysis of the new mutations.

Further it may be provided that testing the second version of the computer program in step (c) comprises the steps of:

(c1) performing tests that upon a mutation analysis of the first version of the computer program detected the mutations classified as removed mutations to ascertain whether the second version of the computer program passes these tests; and (c2) subsequently performing the remaining tests that were used for testing the first version of the computer program.

Preferably, the mutations present in the first version of the computer program are entered in a first list and the mutations present in the second version of the computer program are entered in a second list, wherein in step (b) the first list and the second list are compared with each other in order to classify the mutations.

Particular preferred is that in step (b) the mutations are classified as new mutations that either (b11) can be inserted into lines, statements and/or expressions of the source code of the second version which have been added to the second version of the computer program compared to the first version of the computer program; and/or (b12) can be inserted into lines, statements and/or expressions of the source code of the second version which have been changed in the second version of the computer program compared to the first version of the computer program.

Further, mutations can be classified as removed mutations that either (b13) can be inserted into lines, statements and/or expressions of the source code of the first version which have been deleted in the second version of the computer program compared to the first version of the computer program; and/or (b14) can be inserted into lines, statements and/or expressions of the source code of the first version which have been changed in the second version of the computer program compared to the first version of the computer program.

Here it is preferred to classify all mutations not classified as new mutations or as removed mutations as unaffected mutations.

In one embodiment of the invention the second version of the computer program is in comparison to the first version assessed as "not deteriorated" if the tests are passed that detected upon a mutation analysis of the first version of the computer program the mutations classified as removed mutation. Further may be provided that the source code containing not detected new mutations classified as new mutations upon mutation analysis is characterized as not sufficient tested.

Preferably the source code describes an integrated circuit IC).

The method according to the invention may be carried out using a Field Programmable Gate Array (FPGA).

The method according to the invention allows a fast locating of an incorrect change of a computer program. This is particularly attributed to the fact that selective mutations are used for the testing that are determined by the classification of mutations that can be found in the compared versions of the computer program. Moreover, with the suggested classification it is possible to recognize errors attributable to changes of the code earlier than before, because at first there are carried out tests that would detect removed mutations ("reduced regression testing"). If the tests have been passed in the first version and if there appear errors upon performing the tests in the second version, so the change of the source code from the first to the second version has led to this error. Therefore, the second version is incorrect. Subsequently the mutations classified as new can be subjected to a mutation analysis. Alternative, at first a mutation analysis of the new mutations can be carried out and then tests that detected the mutations classified as removed mutations upon testing the first version of the computer program can be performed.

The method according to the invention may be used advantageously for regression testing of computer programs and/or for the mutation analysis of computer programs.

The invention is hereinafter discussed in more detail with reference to the drawings on the basis of an example. Here, FIGS. 1a and b are showing a flow chart of an embodiment of the method according to the invention.

In the embodiment of the method according to the invention described below the first version of the computer program is compared to the second version of the computer program (see, reference number 1 in FIG. 1a). This can be done using a File Comparison Tool also known as diff tool or with the help of a syntax tree analysis.

Hereinafter, there is represented the source code of a first version of a computer program:

```
1      always @(posedge clk or negedge reset_n) begin
2          if(~reset_n ) begin
3              q_r <= 1'b0;
4          end
5          else begin
6              q_r <= d & enable;
7              q_n_r <= d & enable;
8          end
9          enable <= 1'b0;
10     end
```

After the revision of the computer program the second version is obtained:

```
1      always @(posedge clk or negedge reset_n) begin
2          if(~reset_n ) begin
3              q_r <= 1'b0;
4              q_n_r <= 1'b1;
5          end
6          else begin
7              q_r <= d & enable;
8              q_n_r <= ~d & enable;
9          end
10     end
```

For the classification of the mutants as new mutants, removed mutants, and changed mutants the two versions of the computer program are compared to each other. For that, at first the mutations are determined that can be inserted into the first version (reference mark 2 in FIG. 1a). These mutations, i.e. its positions ("line") in the source code of the first version, are stored in a first list, in the following referred to as "V1-list" (reference mark 3 in FIG. 1). Here an identification number (ID-No.) is assigned to each mutation. Further the type of the mutant in the V1-list is stored.

| V1-list: | | |
|---|---|---|
| ID-No. | line | type |
| 1 | 2 | if |
| 2 | 3 | <= |
| 3 | 3 | constant 0 |
| 4 | 6 | <= |
| 5 | 6 | operator & |
| 6 | 7 | <= |
| 7 | 7 | operator & |
| 8 | 9 | <= |
| 9 | 9 | constant 0 |

Figure 1B:
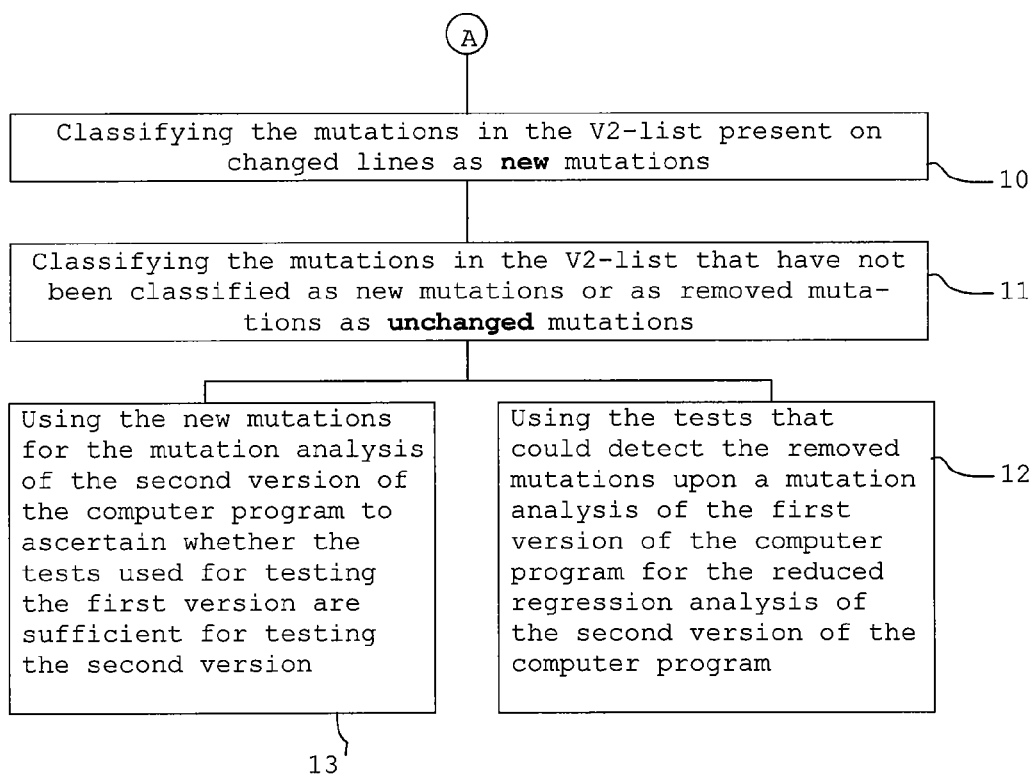

Thereafter, the mutations are determined that can be inserted into the second version of the computer program (reference mark 4 in FIG. 1a). These mutations, i.e. its positions in the source code of the first version, are stored in a list, in the following referred to as "V2-list" (reference mark 5 in FIG. 1a). Here an identification number ("ID-No.") is assigned to each mutation. Further the type of the mutant in the V2-list is stored.

| V2-list | | |
|---|---|---|
| ID-No. | line | type |
| 1 | 2 | if |
| 2 | 3 | <= |
| 3 | 3 | constant 0 |
| 4 | 4 | <= |
| 5 | 4 | constant 1 |
| 6 | 7 | <= |
| 7 | 7 | operator & |
| 8 | 8 | <= |
| 9 | 8 | operator & |
| 10 | 8 | operator ~ |

The comparison (reference mark 6 in FIG. 1a) of the source code of the first version of the computer program to the source code of the second version of the computer program using the diff tool gives the following result:

| column 1 | column 2 |
|---|---|
| 3a4 | |
| > | q_n_r <= 1'b1; |
| 7c8 | |
| < | q_n_r <= d & enable; |
| - - - | |
| > | q_n_r <= ~d & enable; |
| 9d9 | |
| < | enable <= 1'b0; |

The expressions represented in column 1 are in the form of "XyZ", wherein X designates the line in the source code of the first version of the computer program; y represents whether the line in the second version has been added (designated with "a"), whether the line in the second version has been changed (designated with "c"), or whether the line in the second version has been deleted (designated with "d"); and Z designates the line in the source code of the second version of the computer program. Column 2 represents the type of the change.

The result of the comparison with the help of the diff tool is used to classify the mutations.

All mutants in the V2-list that are on added lines (designated with "a") are classified as new mutations ("new") (reference mark 7 in FIG. 1a):

| V2-list | | | |
|---|---|---|---|
| ID-No. | line | type | classified as |
| 1 | 2 | if | |
| 2 | 3 | <= | |
| 3 | 3 | constant 0 | |
| 4 | 4 | <= | new |
| 5 | 4 | constant 1 | new |
| 6 | 7 | <= | |
| 7 | 7 | operator & | |
| 8 | 8 | <= | |
| 9 | 8 | operator & | |
| 10 | 8 | operator ~ | |

Thereafter, all mutations present in the V1-list and on deleted lines (designated with removed) are added to the V2-list and classified as removed mutations ("removed") (reference mark 8 in FIG. 1*a*):

| V2-list | | | |
|---|---|---|---|
| ID-No. | line | type | classified as |
| 1 | 2 | if | |
| 2 | 3 | <= | |
| 3 | 3 | constant 0 | |
| 4 | 4 | <= | new |
| 5 | 4 | constant 1 | new |
| 6 | 7 | <= | |
| 7 | 7 | operator & | |
| 8 | 8 | <= | |
| 9 | 8 | operator & | |
| 10 | 8 | operator ~ | |
| 11 | 9 | <= | removed |
| 12 | 9 | constant 0 | removed |

Then, all mutations present in the V1-list and on changed lines are added to the V2-list and classified as removed mutations ("removed") (reference mark 9 in FIG. 1*a*):

| V2-list | | | |
|---|---|---|---|
| ID-No. | line | type | classified as |
| 1 | 2 | if | |
| 2 | 3 | <= | |
| 3 | 3 | constant 0 | |
| 4 | 4 | <= | new |
| 5 | 4 | constant 1 | new |
| 6 | 7 | <= | |
| 7 | 7 | operator & | |
| 8 | 8 | <= | |
| 9 | 8 | operator & | |
| 10 | 8 | operator ~ | |
| 11 | 9 | <= | removed |
| 12 | 9 | constant 0 | removed |
| 13 | 7 | <= | removed |
| 14 | 7 | operator & | removed |

Then, all mutations present in the V2-list and on changed lines are classified as new mutations (reference mark 10 in FIG. 1*b*):

| V2-list | | | |
|---|---|---|---|
| ID-Nr. | line | type | classified as |
| 1 | 2 | if | |
| 2 | 3 | <= | |
| 3 | 3 | constant 0 | |
| 4 | 4 | <= | new |
| 5 | 4 | constant 1 | new |
| 6 | 7 | <= | |
| 7 | 7 | operator & | |
| 8 | 8 | <= | new |
| 9 | 8 | operator & | new |
| 10 | 8 | operator ~ | new |
| 11 | 9 | <= | removed |
| 12 | 9 | constant 0 | removed |
| 13 | 7 | <= | removed |
| 14 | 7 | operator & | removed |

Finally, all mutations in the V2-list not classified as new or removed mutations are classified as unchanged mutations ("unchanged") (reference mark 11 in FIG. 1*b*):

| V2-list | | | |
|---|---|---|---|
| ID-Nr. | line | type | classified as |
| 1 | 2 | if | unchanged |
| 2 | 3 | <= | unchanged |
| 3 | 3 | constant 0 | unchanged |
| 4 | 4 | <= | new |
| 5 | 4 | constant 1 | new |
| 6 | 7 | <= | unchanged |
| 7 | 7 | operator & | unchanged |
| 8 | 8 | <= | new |
| 9 | 8 | operator & | new |
| 10 | 8 | operator ~ | new |
| 11 | 9 | <= | removed |
| 12 | 9 | constant 0 | removed |
| 13 | 7 | <= | removed |
| 14 | 7 | operator & | removed |

In one embodiment (reference mark 12 in FIG. 1*b*) there are used at first or exclusively the mutants classified in the V2-list as removed mutations for the reduced regression testing of the second version of the computer program. Here, the second version of the computer program is assessed as "not deteriorated" against the first version if the tests are passed that detected upon a mutation analysis of the first version of the computer program the mutations classified as removed mutations.

In another embodiment (reference mark 13 in FIG. 1*b*) of the invention there are used at first or exclusively the mutants classified in the V2-list as new mutations for the mutation analysis of the second version of the computer program. Source code containing not detected new mutants classified upon the mutation analysis of the mutations as new mutations is characterized for the tester as not sufficiently tested.

Thus, by the classification of the mutations and the use of at first or exclusively the mutations either classified as new or removed for testing the second version of the computer program the invention is considerably saving time over the known methods due to the fast locating of incorrect changes since the classification and subsequent selection of particular mutations permits performing only of that tests which are able to detect said mutations.

For example, if at first (or exclusively) tests are carried out that are able to detect mutations which have been detected in the first version and classified as removed mutations, so in a very early state of the test can be recognized whether in the first version existing features of the computer program that shall not be affected by its revision have been impaired.

Removed mutations represent a change of feature. In view of the aim of the regression analysis to assure that all changes of source code are tested a minimum amount ("subset") of tests is selected by selecting only that tests detecting removed mutations which according to the analysis of the first version are known to be able to detect possible problems closely related to the changes made. The selected tests have to be passed to confirm that the source code of the second version is still correct. This results in a fast assessment whether the changes made are incorrect.

On the other hand, if at first (or exclusively) a mutation analysis is carried out to find out which of the mutations classified as new mutations can be detected by tests of the test set used for testing the first version of the computer program, so not detected mutants show that the test set is not complete, i.e. comprises no tests which are able to detect at least one particular new mutation. In this way it is possible to find out whether the new features are actually tested by the test set used.

Preferably, at first there are carried out tests that are able to detect mutations that have been detected in the first version and classified as removed mutations. Thereafter, a mutation analysis of the new mutations is conducted.

The invention claimed is:

1. A method for testing a circuit specification after changing a first version of the circuit specification into a second version of the circuit specification due to a revision of the circuit specification, the method comprising:
   receiving, at one or more computer systems, a first set of mutations associated with the first version of the circuit specification and a second set of mutations associated with the second version of the circuit specification;
   identifying, with the one or more processors associated with one or more computer systems, changed and unchanged mutations in the first set of mutations and in the second set of mutations based on a comparison between the second version of the circuit specification and the first version of the circuit specification, wherein
   mutations that can be inserted only in the first version of the circuit specification or only in the second version of the circuit specification are identified as changed mutations, and mutations that can be inserted in the first version of the circuit specification and the second version of the circuit specification are identified as unchanged mutations; and
   generating, with the one or more processor associated with the one or more computer systems, information configured to test the second version of the circuit specification using at least a portion of the identified mutations classified as the changed mutations.

2. The method according to claim 1, further comprising performing mutation analysis of the second version of the circuit specification based on the at least a portion of the identified mutations classified as the changed mutations.

3. The method according to claim 1, further comprising selecting one or more tests for reduced regression testing of the second version of the circuit specification based on the at least a portion of the identified mutations classified as the changed mutations.

4. The method according to claim 1, further comprising:
   selecting one or more tests for reduced regression testing of the second version of the circuit specification based on the at least a portion of the identified mutations classified as the changed mutations that are applicable to the first set of mutations; and
   performing mutation analysis of the second version of the circuit specification based on the at least a portion of the identified mutations classified as the changed mutations that are applicable to the second set of mutations.

5. The method according to claim 1 wherein mutations identified as changed mutations that can be inserted into the second version but not into the first version are classified as new mutations.

6. The method according to claim 1 wherein mutations identified as changed mutations that can be inserted into the first version but not into the second version are classified as removed mutations.

7. The method according to claim 5 wherein, in testing the second version of the circuit specification, a mutation analysis of the new mutations is conducted.

8. The method according to claim 6 wherein, in testing the second version of the circuit specification, a mutation analysis of the removed mutations is conducted.

9. A non-transitory computer-readable medium storing computer-executable code for testing a circuit specification after changing a first version of the circuit specification into a second version of the circuit specification due to a revision of the circuit specification, the non-transitory computer-readable medium comprising:
   code for receiving a first set of mutations associated with the first version of the circuit specification and a second set of mutations associated with the second version of the circuit specification;
   code for identifying changed and unchanged mutations in the first set of mutations and in the second set of mutations based on a comparison between the second version of the circuit specification and the first version of the circuit specification, wherein
   mutations that can be inserted only in the first version of the circuit specification or only in the second version of the circuit specification are identified as changed mutations, and
   mutations that can be inserted in the first version of the circuit specification and the second version of the circuit specification are identified as unchanged mutations; and
   code for generating information configured to test the second version of the circuit specification using at least a portion of the identified mutations classified as the changed mutations.

10. The non-transitory computer-readable medium according to claim 9 further comprising code for performing mutation analysis of the second version of the circuit specification based on the at least a portion of the identified mutations classified as the changed mutations.

11. The non-transitory computer-readable medium according to claim 9 further comprising code for selecting one or more tests for reduced regression testing of the second version of the circuit specification based on the at least a portion of the identified mutations classified as the changed mutations.

12. The non-transitory computer-readable medium according to claim 9 further comprising:
   code for selecting one or more tests for reduced regression testing of the second version of the circuit specification based on the at least a portion of the identified mutations classified as the changed mutations that are applicable to the first set of mutations; and
   code for performing mutation analysis of the second version of the circuit specification based on the at least a portion of the identified mutations classified as the changed mutations that are applicable to the second set of mutations.

13. The non-transitory computer-readable medium according to claim 9 wherein mutations identified as changed mutations that can be inserted into the second version but not into the first version are classified as new mutations.

14. The non-transitory computer-readable medium according to claim 13 wherein, in testing the second version of the circuit specification, a mutation analysis of the new mutations is conducted.

15. The non-transitory computer-readable medium according to claim 9 wherein mutations identified as changed mutations that can be inserted into the first version but not into the second version are classified as removed mutations.

16. The non-transitory computer-readable medium according to claim 15 wherein, in testing the second version of the circuit specification, a mutation analysis of the removed mutations is conducted.

17. A system for testing a circuit specification after changing a first version of the circuit specification into a second version of the circuit specification due to a revision of the circuit specification, the system comprising:
a hardware processor; and
a memory storing the first version of the circuit specification, the second version of the circuit specification, a first set of mutations associated with the first version of the circuit specification, a second set of mutations associated with the second version of the circuit specification, and a set of instructions that when executed by the processor cause the processor to:
compare the second version of the circuit specification with the first version of the circuit specification, wherein mutations that can be inserted only in the first version of the circuit specification or only in the second version of the circuit specification are identified as changed mutations, and mutations that can be inserted in the first version of the circuit specification and the second version of the circuit specification are identified as unchanged mutations;
identify one or more mutations in the second set of mutations associated with the second version of the circuit specification found only in the second version of the circuit specification; and
generate information configured to test the second version of the circuit specification using the identified mutations found only in the second version of the circuit specification.

18. The system according to claim 17 wherein the set of instructions further cause the processor to perform mutation analysis of the second version of the circuit specification based on the identified mutations.

19. The system according to claim 17 wherein the set of instructions further cause the processor to select one or more tests for reduced regression testing of the second version of the circuit specification based on the identified mutations.

20. The system according to claim 17 wherein the set of instructions further cause the processor to:
select one or more tests for reduced regression testing of the second version of the circuit specification based on the identified mutations; and
perform mutation analysis of the second version of the circuit specification based on the identified mutations.

21. The system according to claim 17 wherein the identified mutations are identified as changed mutations.

22. The system according to claim 17 wherein the set of instructions further cause the processor to
identify one or more mutations in the second set of mutations associated with the second version of the circuit specification found in a changed line of the second version of the circuit specification; and
generate the information configured to test the second version of the circuit specification using the identified mutations found on the changed line of the second version of the circuit specification.

23. The system according to claim 17 wherein mutations found in the first version but not into the second version are classified as removed mutations.

24. The system according to claim 23 wherein, in testing the second version of the circuit specification, a mutation analysis of the removed mutations is conducted.

* * * * *